(12) United States Patent
Kamura et al.

(10) Patent No.: US 6,264,751 B1
(45) Date of Patent: Jul. 24, 2001

(54) MECHANISM FOR PERFORMING WATER REPELLENCY PROCESSING ON BOTH SIDES SIMULTANEOUSLY

(75) Inventors: Hitoshi Kamura; Masaaki Yoshihara; Hajime Kamiya, all of Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 09/214,676

(22) PCT Filed: May 18, 1998

(86) PCT No.: PCT/JP98/02178

§ 371 Date: Apr. 1, 1999

§ 102(e) Date: Apr. 1, 1999

(87) PCT Pub. No.: WO98/52075

PCT Pub. Date: Nov. 19, 1998

(51) Int. Cl.[7] .................................................. C23C 14/00
(52) U.S. Cl. ........................ 118/725; 118/726; 118/730
(58) Field of Search ................................ 118/726, 725, 118/730

(56) References Cited

FOREIGN PATENT DOCUMENTS

| | | |
|---|---|---|
| 58-107484 | * 6/1983 | (JP) . |
| 5-295538 | * 2/1992 | (JP) . |
| 4-81802 | * 3/1992 | (JP) . |
| 4-202773 | * 7/1992 | (JP) . |
| 4-221061 | * 8/1992 | (JP) . |
| 5-215905 | * 8/1993 | (JP) . |
| 6-81129 | * 3/1994 | (JP) . |
| 6-158287 | * 6/1994 | (JP) . |
| 6-192835 | * 7/1994 | (JP) . |
| 6-248434 | * 9/1994 | (JP) . |
| 7-173620 | * 11/1995 | (JP) . |
| 7-331421 | * 12/1995 | (JP) . |

* cited by examiner

Primary Examiner—Richard Bueker
(74) Attorney, Agent, or Firm—Oliff & Berridge, PLC

(57) ABSTRACT

A substrate holder (22) on which a plurality of optical lens base materials (24) are arranged is installed to be rotatable in a vacuum atmosphere and a vacuum processing chamber (16) for forming water repellent films on the surfaces of the optical lens base materials, and further a both sides simultaneous water repellency processing mechanism is installed in this vacuum processing chamber. In regard to the substrate holder (22), an upper side water repellency processing unit (30) and a lower side water repellency processing unit (40) are provided, and the upper side water repellency processing unit forms the water repellent film on the upper side of the optical lens base material, while the lower side water repellency processing unit forms the water repellent film on the lower side of the optical lens base material. This configuration forms the water repellent films simultaneously onto the both sides of the optical lens base material. A film thickness correcting mechanism for the water repellency processing is composed of a film thickness correcting plate (51, 52) for correcting a film thickness difference, which is arranged between the water repellency processing unit and the optical lens base material.

6 Claims, 7 Drawing Sheets

FIG. 9

| | AMOUNT OF DEPOSITION | | FIRST LINE | SECOND LINE | THIRD LINE |
|---|---|---|---|---|---|
| CASE OF USING NO CORRECTION PLATE | LITTLE | ANGLE OF CONTACT | 80° | 110° | 95° |
| | | INTERFERENCE COLOR | MINUTE CHANGE | MINUTE CHANGE | MINUTE CHANGE |
| | MUCH | ANGLE OF CONTACT | 110° | 110° | 110° |
| | | INTERFERENCE COLOR | GREAT CHANGE | GREAT CHANGE | GREAT CHANGE |
| CASE OF USING CORRECTION PLATE | LITTLE | ANGLE OF CONTACT | 80° | 80° | 80° |
| | | INTERFERENCE COLOR | MINUTE CHANGE | MINUTE CHANGE | MINUTE CHANGE |
| | MUCH | ANGLE OF CONTACT | 110° | 110° | 110° |
| | | INTERFERENCE COLOR | MINUTE CHANGE | MINUTE CHANGE | MINUTE CHANGE |

MECHANISM FOR PERFORMING WATER REPELLENCY PROCESSING ON BOTH SIDES SIMULTANEOUSLY

TECHNICAL FIELD

The present invention relates to a both sides simultaneously water repellency processing mechanism which performs a water repellent film forming process on both sides of an optical lens such as a spectacle plastic lens, and which, when depositing the water repellent films on the surfaces of the optical lenses by vacuum evaporation, equalizes the thickness of the water repellent films by a correction.

BACKGROUND ART

In an optical lens such as a spectacle plastic lens, an antireflection film is coated on the surfaces thereof. The antireflection film is generally formed by use of an inorganic oxide such as $ZrO_2$ or $SiO_2$. Since the inorganic oxide used for forming the antireflection film has an inferior property in terms of water repellency or oil repellency, the surfaces of the optical lens applied with the antireflection film are liable to become dirty due to sweat or finger marks, a sort of oil and the like. Also, once these dirty marks adhered to the surfaces of the optical lens, it was difficult to remove them. Accordingly, the optical lens has been desired to have a dirt-prevention characteristic onto the surfaces thereof. Conventionally, in order to solve this problem, a water repellent film has been deposited on the above-mentioned antireflection film formed on the surfaces of the optical lens (for example, disclosed in the publications of JP-A-5-215905, JP-A-60-221470 and JP-A-4-218538). As conventional methods of forming the water repellent film on the surface of the optical lens, a dipping method, a vacuum evaporation method utilizing heat evaporation or a CVD method have been utilized.

Furthermore, in the recent methods of fabricating the optical lenses, a technology for depositing the water repellent film onto the surface of the lenses by utilizing a vacuum evaporation method in a final process has been proposed. In forming the water repellent film by the vacuum evaporation method, a plurality of optical lens base materials (in unit of a lot) are set on a circular planar holder which is rotatable, and the water repellent films are deposited on the optical lens base materials in every lot while the holder is rotating.

Further, in recent years, as a system for depositing the antireflection film on the surfaces of the optical lens, it has been proposed to use a deposition system for depositing the antireflection film by utilizing a sputtering method which is one of semiconductor manufacturing technologies. In this sputtering film deposition system, a plurality of optical lenses are arranged on a lens tray so that the both sides of the lenses can be simultaneously deposited by the sputtering method, and practically, the both sides of the optical lenses on the lens tray which is set to be rotatable freely in a sputtering chamber are simultaneously deposited with the antireflection film by the sputtering method using two targets disposed in the upper and lower sides of the lens tray.

And then, as mentioned above, the process of forming the water repellent film is carried out as the final process after the process of depositing the antireflection film. The plurality of optical lenses, each of which has the antireflection films formed on the both surfaces thereof respectively, are carried out from the sputtering deposition chamber with the state of being set on the lens tray, and thereafter they are carried in a vacuum processing chamber for forming the water repellent film. As the arrangement state of the optical lenses, they are supported to be horizontal on the lens tray and their both surfaces are kept to face to upper and lower sides respectively owing to the structure of the lens tray. Accordingly, it is also desired that the both sides of the optical lenses are simultaneously deposited with the water repellent film in the final process for forming the water repellent film. Thereby, it can be expected that efficiency in the process of forming the water repellent film is improved and further a performance characteristic of the water repellent film is improved.

Further, conventionally, it has been considered that a thickness distribution of the water repellent film formed by the vacuum evaporation method is satisfactory. However, when applying the vacuum evaporation method to the thin film formation for a spectacle lens with a meniscus shape, it is required to realize a film thickness distribution having an uniformity with a higher precision without being affected by a curvature of the lens. If there is dispersion on the film thickness of the water repellent films, it is difficult to keep the quality and so on of the optical lens in a desired specific level because the dispersion concerning interference characteristics or qualities among optical products are occurred.

An object of the present invention is to provide a both sides simultaneous water repellency processing mechanism capable of improving the efficiency of the water repellency processing by the process of forming the water repellent film onto the both surfaces of the optical lens simultaneously and thereby improving work efficiency and productivity.

Another object of the present invention is to decrease the film thickness difference in a water repellent film or among the films deposited on the surfaces of the plurality of optical lenses set on the holder by utilizing the vacuum evaporation method, and to make the film thickness distribution uniform with a high precision.

DISCLOSURE OF INVENTION

A substrate holder in which a plurality of optical lens base materials are arranged is installed rotatably in a vacuum atmosphere and a vacuum processing chamber for depositing a water repellent film onto each of the surfaces of the optical lens base materials is provided. A both sides simultaneous water repellency processing mechanism is arranged in this vacuum processing chamber. The both sides simultaneous water repellency processing mechanism has an upper side water repellency processing unit and a lower side water repellency processing unit in regard to the substrate holder, and is configured so that the upper side water repellency processing unit forms a water repellent film on the upper side of the optical lens base materials and the lower side water repellency processing unit forms a water repellent film on the lower side thereof. This configuration makes it possible that the both sides of the optical lens base materials is simultaneously deposited with the water repellent film by means of the water repellency processing units arranged in the upper and lower sides.

In the above-mentioned both sides simultaneous water repellency processing mechanism, the upper and the lower side water repellency processing units have respectively a water repellent material chip and a heater for heating the material chip. The water repellent material chip which is heated by the heater is caused to evaporate a water repellent substance and thereby the upper and lower sides of the optical lens base material is adhered with the water repellent substance by vapor deposition to result in forming the water repellent film.

Further, the upper and the lower water repellency processing units have respectively a temperature measuring chip, a thermocouple added to the temperature measuring chip and a control section for controlling a heating temperature due to the heater on the basis of the detection signal outputted from the thermocouple.

The water repellent material chip is preferably provided with a heating board such as a molybdenum plate and so on.

The upper side water repellency processing unit enables to carry out the vapor deposition downward and is further provided with a support stainless steel plate in which the water repellent material chip and the temperature measuring chip are mounted through a fall prevention mechanism and are faced to the upper side of the optical lens base materials. Also, the lower side water repellency processing unit is provided with a heating board on which the water repellent material chip and the temperature measuring chip are mounted.

Further, a film thickness correction mechanism for the water repellency processing is used within a vacuum processing chamber in which the water repellency processing unit forms the water repellent films onto the surfaces of the optical lens base materials by the vacuum evaporation. The film thickness correction mechanism comprises a film thickness correction plate for correcting a film thickness difference of the water repellent film, which is arranged between the above-mentioned water repellency processing unit and the optical lens base materials.

The film thickness correction plate causes a direct influence to the optical lens base materials owing to the water repellent substance evaporated from the water repellency processing unit to be weakened, and makes the water repellent substance deposited onto the optical lens base materials uniform. Therefore, it becomes possible that the film thickness difference in the water repellent film or among the films deposited on the plurality of optical lens base materials is reduced and the uniformity of the film thickness distribution is heightened.

The film thickness correction plate is preferably a mask member for adjusting the film thickness difference, which is arranged in a direction defined by connection between a periphery section and a center section in a circular planar substrate holder set to be horizontal and rotated, on which the plurality of optical lens base materials whose surfaces have a curvature independently are disposed on concentric circles in a horizontal state.

The above-mentioned water repellency processing unit comprises an upper side and a lower side water repellency processing units, which respectively form water repellent films simultaneously on the upper and the lower sides of the optical lens base material, and the mask member comprises the upper and the lower mask members.

BRIEF DESCRIPTION OF DRAWINGS

FIG. 9 is a diagram indicating a table used for comparing effects in response to presence or no presence of the film thickness correction plate.

BEST MODE FOR CARRYING OUT THE INVENTION

Preferred embodiments of the present invention will be explained below based on the appended drawings.

Figure 1:
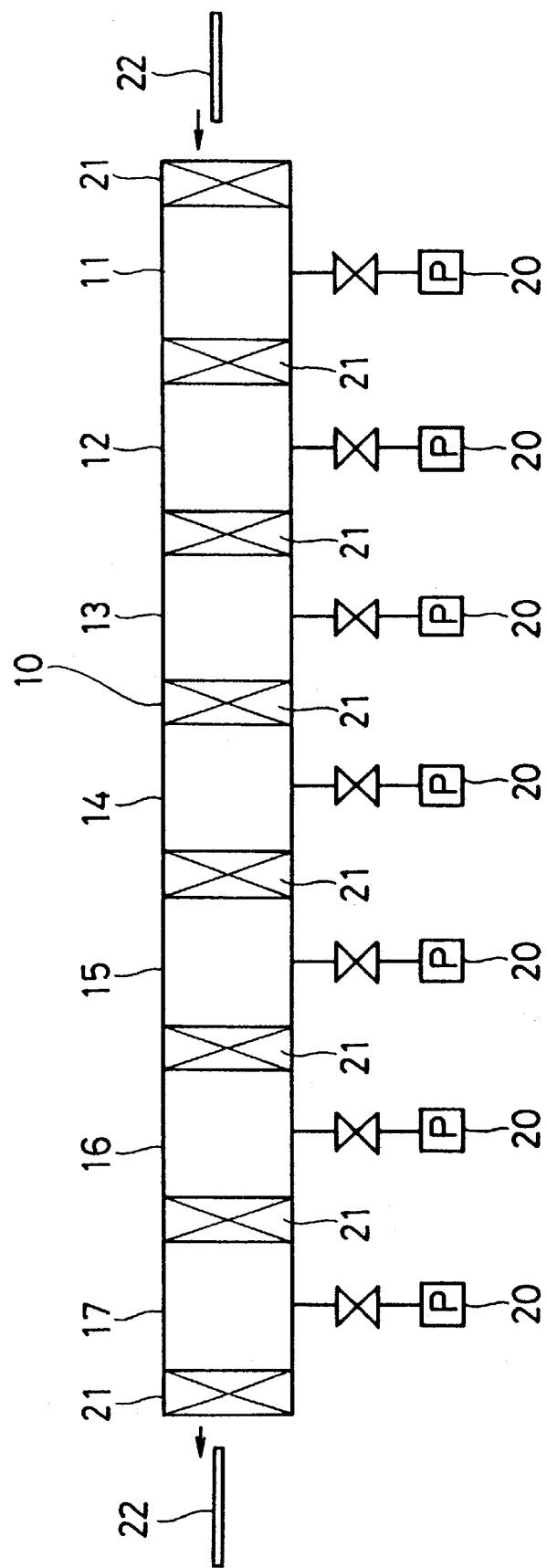
FIG. 1 is a typical schematic diagram showing a whole configuration of a thin film formation apparatus to which the present invention is applied.

FIG. 1 shows typically a whole configuration of a thin film forming apparatus to which a both sides simultaneous water repellency processing mechanism of the present invention is applied. This thin film forming apparatus 10 is a successive-type apparatus in which a plurality of vacuum chambers 11–17 are connected in series.

Each of the vacuum chambers in the thin film forming apparatus 10 is evacuated by a vacuum evacuation system 20 attached to the chamber and is maintained to be of a vacuum state. Gate valves 21 are respectively arranged between any two adjacent chambers of the vacuum chambers 11–17. This configuration can set each of the vacuum chambers to have a vacuum atmosphere separately.

In the thin film forming apparatus 10 having the above-mentioned configuration, for example, a vacuum chamber 11 at a right end is an entrance chamber, a vacuum chamber 17 at a left end is an exit chamber, a vacuum chamber 12 is a vacuum processing chamber for depositing a hard film, a vacuum chamber 14 is a vacuum processing chamber for depositing an antireflection film, and a vacuum chamber 16 is a vacuum processing chamber for depositing a water repellent film. Other two vacuum chambers 13 and 15 are intermediate chambers arranged between the film deposition vacuum processing chambers.

In the above thin film formation apparatus 10, thin film formation processing is carried out against objects to be processed in each of the vacuum chambers 12, 14 and 16. In the present embodiment, the object to be processed is a plastic base material. This plastic base material is a spectacle plastic lens base material with a diopter of −4.00 and a circular meniscus shape, which is one example of an optical lens. The optical lens may be made of glass. Many plastic base materials are mounted on a substrate holder 22 which works as a lens tray. The substrate holder 22 has preferably a circular planar shape and is used to maintain a horizontal state. As shown in FIG. 1, the substrate holder 22 which is movable in upward/downward and horizontal directions is carried into the entrance chamber 11 through the gate valve 21 at a right end, wherein an upward/downward position of it is determined, and next it is conveyed from a right side to a left side, and further after determining the upward/downward position of it, it is carried out to the outside through the gate valve 21 at a left end. While the substrate holder 22 is moving, the hard film formation in the vacuum chamber 12, the antireflection film formation in the vacuum chamber 14 and the water repellent film formation in the vacuum chamber 16 are performed successively onto the both sides of the plurality of plastic base materials mounted on the substrate holder 22. The substrate holder 22 being maintained to be horizontal is conveyed in each of the vacuum chambers 11–17 of the thin film formation apparatus 10. As a conveyance apparatus, a roller or a chain mechanism and so on is used, for example.

In the vacuum chamber 12, the hard film with abrasion resistance is simultaneously deposited on the both sides of the plastic base materials by utilizing a CVD method, for example. In the vacuum chamber 14, the antireflection film is simultaneously deposited on the both sides of the plastic base materials by utilizing a sputtering method, for example. In addition, in the vacuum chamber 16, the water repellent film is simultaneously deposited on the both sides of the plastic base materials in the vacuum atmosphere. In the following description, the deposition of the water repellent film carried out in the vacuum chamber 16 will be explained in detail.

The both sides simultaneous water repellency processing mechanism is equipped in the above-mentioned vacuum chamber 16. Hereinafter, a mechanism for performing the water repellency processing to the both sides simultaneously is explained by referring to FIGS. 2–7.

Figure 2:
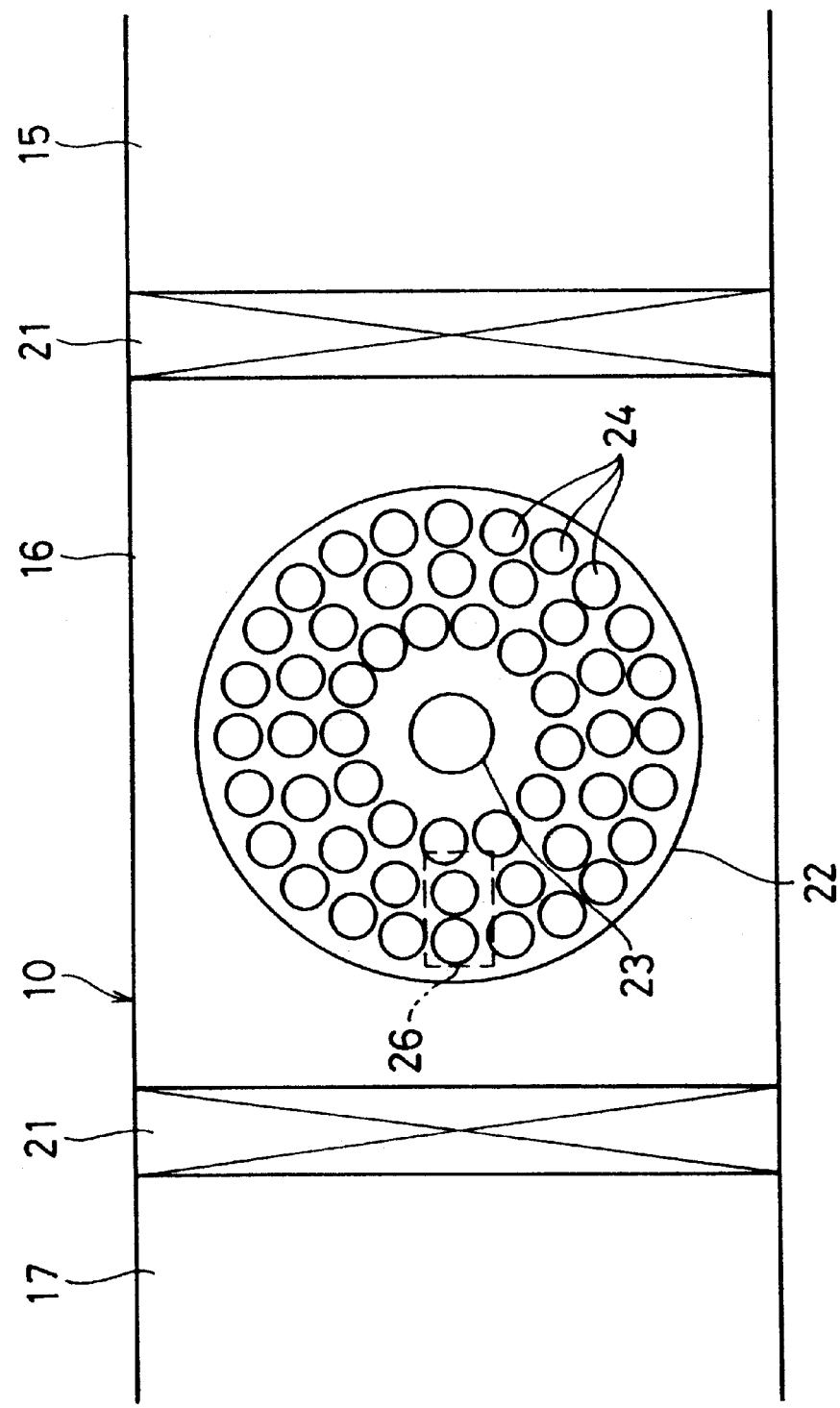
FIG. 2 is a plan view showing a substrate holder set in a vacuum chamber used for forming a water repellent film.
Figure 3:
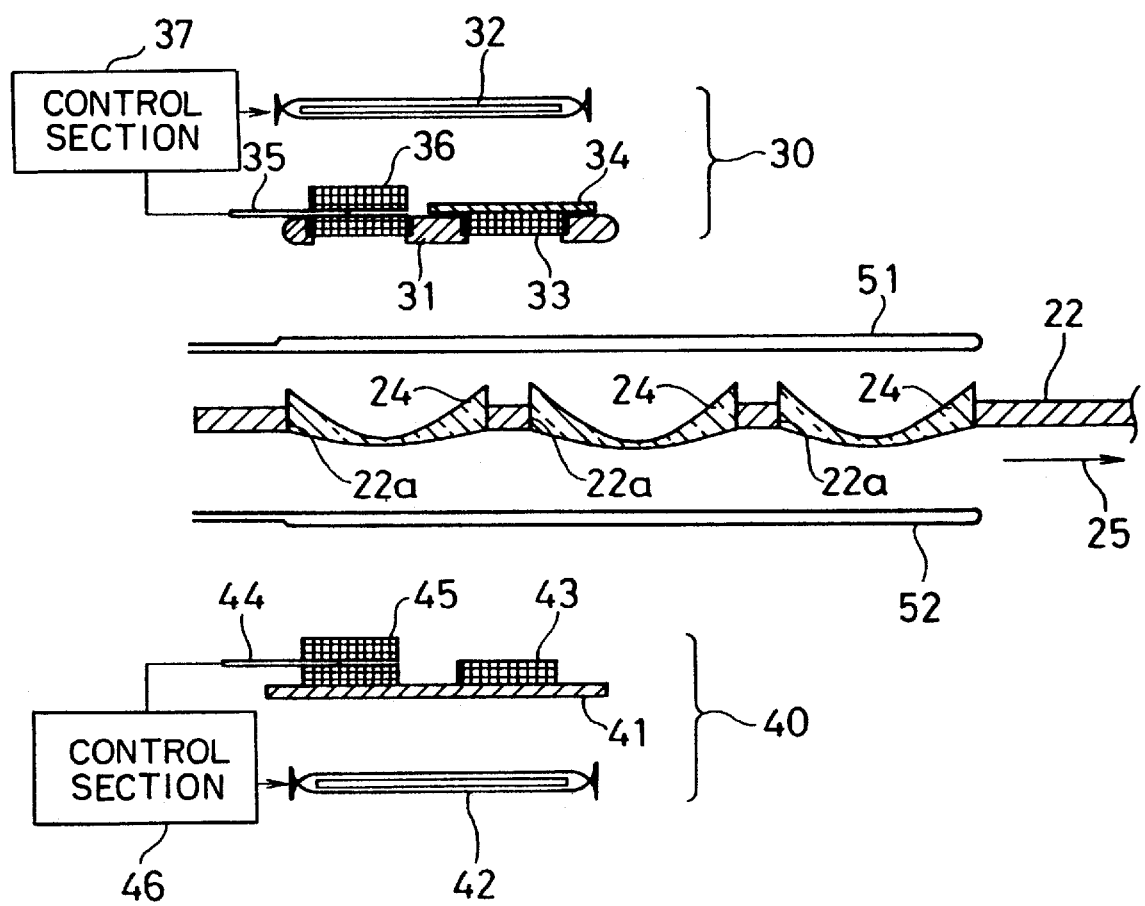
FIG. 3 is a longitudinal sectional view of an important section showing a typical embodiment of the present invention.

FIG. 2 is a plan view showing the substrate holder 22 set in the vacuum chamber 16. The substrate holder 22 which is flat plate-like and has a circular plane shape is set up to be freely rotatable by means of a center support member 23. When depositing the water repellent film, the substrate holder 22 is being rotated at a predetermined speed of revolution. A lot of plastic base materials 24 are mounted on the substrate holder 22. In the substrate holder 22 a lot of plastic base materials 24 are arranged on some almost concentric circles. As shown in FIG. 3, each plastic base material 24 on the substrate holder 22 is put in a holding hole 22a and is set therein so that an upper surface (concave surface) and a lower surface (convex surface) of the plastic base material 24 are exposed to an upper space and a lower space respectively. In FIG. 3, an arrow 25 indicates a direction toward a central section of the substrate holder 22.

To a lot of plastic base materials 24 set on the above substrate holder 22, water repellency processing units 30 and 40 are respectively arranged at the upper and the lower sides of the substrate holder 22. A spot shown by a dot line 26 in FIG. 2 is an arrangement place of each of these water repellency processing units. The both sides simultaneous water repellency processing mechanism is comprised of an upper water repellency processing unit 30 and a lower water repellency processing unit 40. The water repellency processing unit 30 deposits the water repellent film on the upper surface of the plastic base materials 24, while the water repellency processing unit 40 deposits the water repellent film on the lower surface thereof. Accordingly, the water repellency processing unit 30 arranged at the upper side is an upper side water repellency processing unit, while the water repellency processing unit 40 arranged at the lower side is a lower side water repellency processing unit. Thus, the upper and lower sides of each of many plastic base materials 24 arranged in the substrate holder 22 are deposited with the water repellent film simultaneously.

The water repellency processing unit 30 is composed of a stainless steal plate 31 arranged in the upper side of the substrate holder 22 and a halogen lamp 32 as a heating means arranged above the stainless steal plate 31. In the stainless steel plate 31, there are a water repellent material chip 33 and a heating board arranged on the chip, such as a molybdenum plate 34, and a temperature measuring chip 36 with a thermocouple 35. A preferable water repellent material chip is especially a porous material, and to obtain a moderate vapor deposition rate is possible by heating the porous material impregnated with a water repellent solution of fluorine compound disclosed by JP-A-5-215905, for example. As for the water repellent material chip made of the porous material, to describe more concretely, it is preferable to use a sintering filter made of metal powder with high thermal conductivity such as copper and so on. Further, it is suitable that a degree of mesh in the porous material is 40–200 micron and preferably 80–120 micron from the point of view of realizing a moderate vapor deposition rate.

Figure 4:
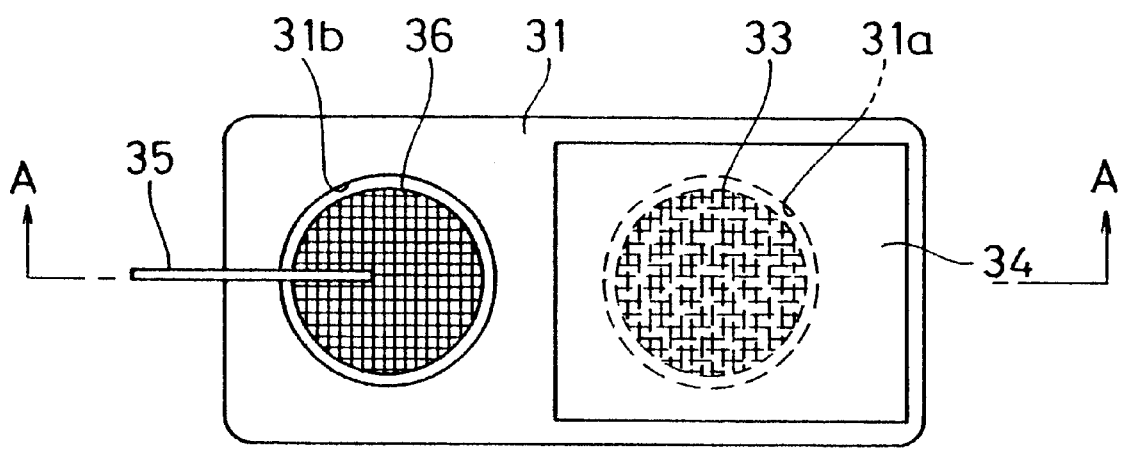
FIG. 4 is an enlarged plan view of an important section in an upper side water repellency processing unit.
Figure 5:
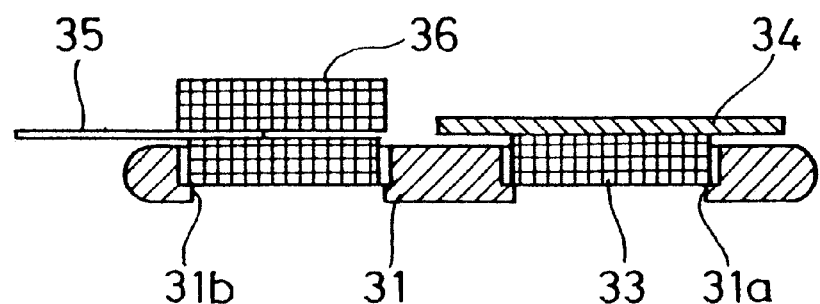
FIG. 5 is a sectional view taken on line A—A in FIG. 4.

FIGS. 4 and 5 show enlarged figures as to important sections of the upper water repellency processing unit 30 having a holding mechanism for preventing the water repellent material chip from falling and the vapor depositing function toward the lower side, which are one of features of the present invention. FIG. 4 is a plan view and FIG. 5 is a sectional view taken on line A—A in FIG. 4. The stainless steel plate 31 has circular penetrating holes 31a and 31b with a difference in level for preventing the water repellent material chip 33 from falling, and the hole 31a accommodates the chip 33 so as not to be fallen, while the hole 31b accommodates the temperature measuring chip made of the porous material identical to that used for the water repellent material chip 33, which is not impregnated with a water repellent agent. The water repellent material chip 33 is arranged in the hole 31a to face to the upper side (concave surface) of the plastic base material 24 through the lower opening of the hole 31a at intervals of 20 cm (usually 10–60 cm, further preferably 15–30 cm) in height, and the heating plate 34 made of molybdenum is arranged above the chip 33. Also, the temperature measuring chip 36 is similarly arranged to face to the plastic base material 24 through a lower opening of the hole 31b with a difference in level for preventing the chip from falling. A detection signal outputted from the thermocouple 35 added to the temperature measuring chip 36 is inputted to a control section 37. The control section 37 controls the heating temperature due to the halogen lamp 32 to become a suitable temperature in response to an atmospheric temperature detected by the thermocouple 35. Then, to heat the water repellent material chip 33 by the halogen lamp 32 through the molybdenum plate 34 causes the water repellent substance to be evaporated downward and the molybdenum plate 34 prevents the vapor deposition in the upper side, and thereby the upper surface of the plastic base material 24 is deposited with the water repellent film. Further, although in this embodiment the state of arranging a molybdenum plate on the temperature measuring chip is omitted for the sake of convenience, the state is actually as same as that based on the condition as to the lower water repellency processing unit.

On the other hand, the lower water repellency processing unit 40 is composed of a molybdenum plate 41 arranged below the substrate holder 22, for example, and a halogen lamp 42 as a heating means arranged below the molybdenum plate 41. The molybdenum plate 41 functions as a heating board. There are a water repellent material chip 43 and a temperature measuring chip 45 with a thermocouple 44, and only arrangement as to respective members on the molybdenum plate 41 is different from the corresponding arrangement of the upper water repellency processing unit.

Figure 6:
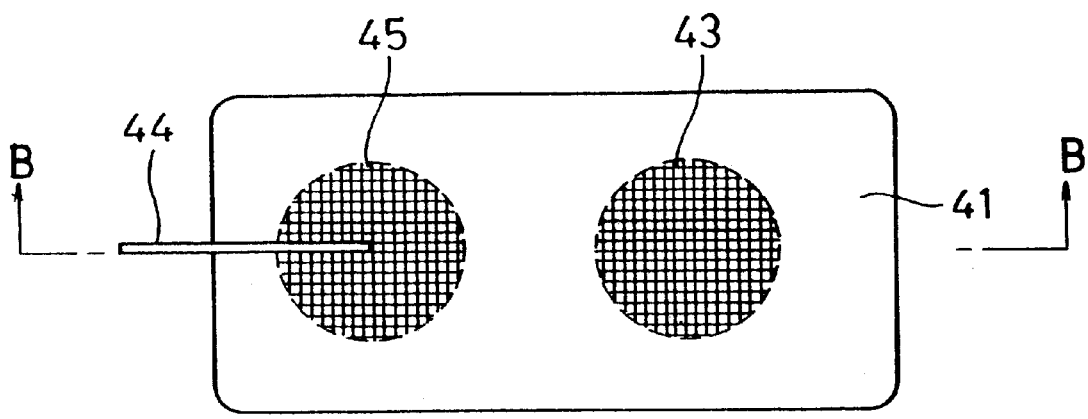
FIG. 6 is an enlarged plan view of an important section in a lower side water repellency processing unit.
Figure 7:
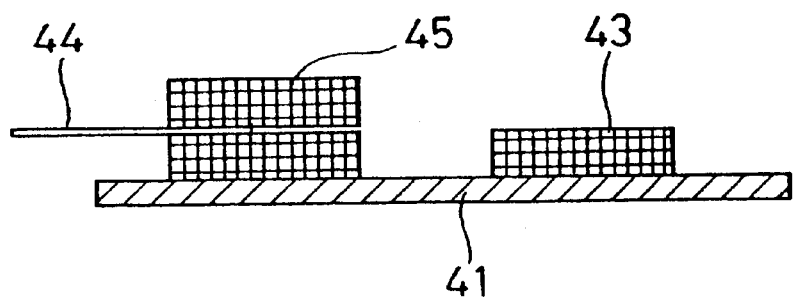
FIG. 7 is a sectional view taken on line B—B in FIG. 6.

FIGS. 6 and 7 show enlarged figures as to important sections of the above water repellency processing unit 40. FIG. 6 is a plan view and FIG. 7 is a sectional view taken on line B—B in FIG. 6. The water repellent material chip 43 and the temperature measuring chip 45 are facing to the lower side (convex surface) of the plastic base material 24. A detection signal outputted from the thermocouple 44 provided in the temperature measuring chip 45 is inputted into a control section 46. The control section 46 controls the heating temperature due to the halogen lamp 42 in response to an atmospheric temperature detected by the thermocouple 44. To heat the water repellent material chip 43 by the halogen lamp 42 through the molybdenum plate 43 causes the water repellent substance to be evaporated, and thereby the lower surface of the plastic base material 24 is deposited with the water repellent film. Thus, the water repellency function is as same as the case of the upper water repellency processing unit.

In accordance with the above-mentioned configuration, the both sides of all of the plastic base materials 24 arranged on the substrate holder 22 can be simultaneously deposited with the water repellent film under the same control by the water repellency processing units 30 and 40 arranged at the upper and the lower positions, since the substrate holder 22 is rotating. Especially, the upper water repellency processing unit 30 arranged above the plastic base material can perform the water repellency processing to this material from the upper side because the above configuration is adopted. As mentioned above, in the vacuum chamber 16 for depositing the water repellent film, the water repellent film can be simultaneously deposited onto the both sides of a lot of plastic base materials 24 mounted on the substrate holder 22.

Figure 8:
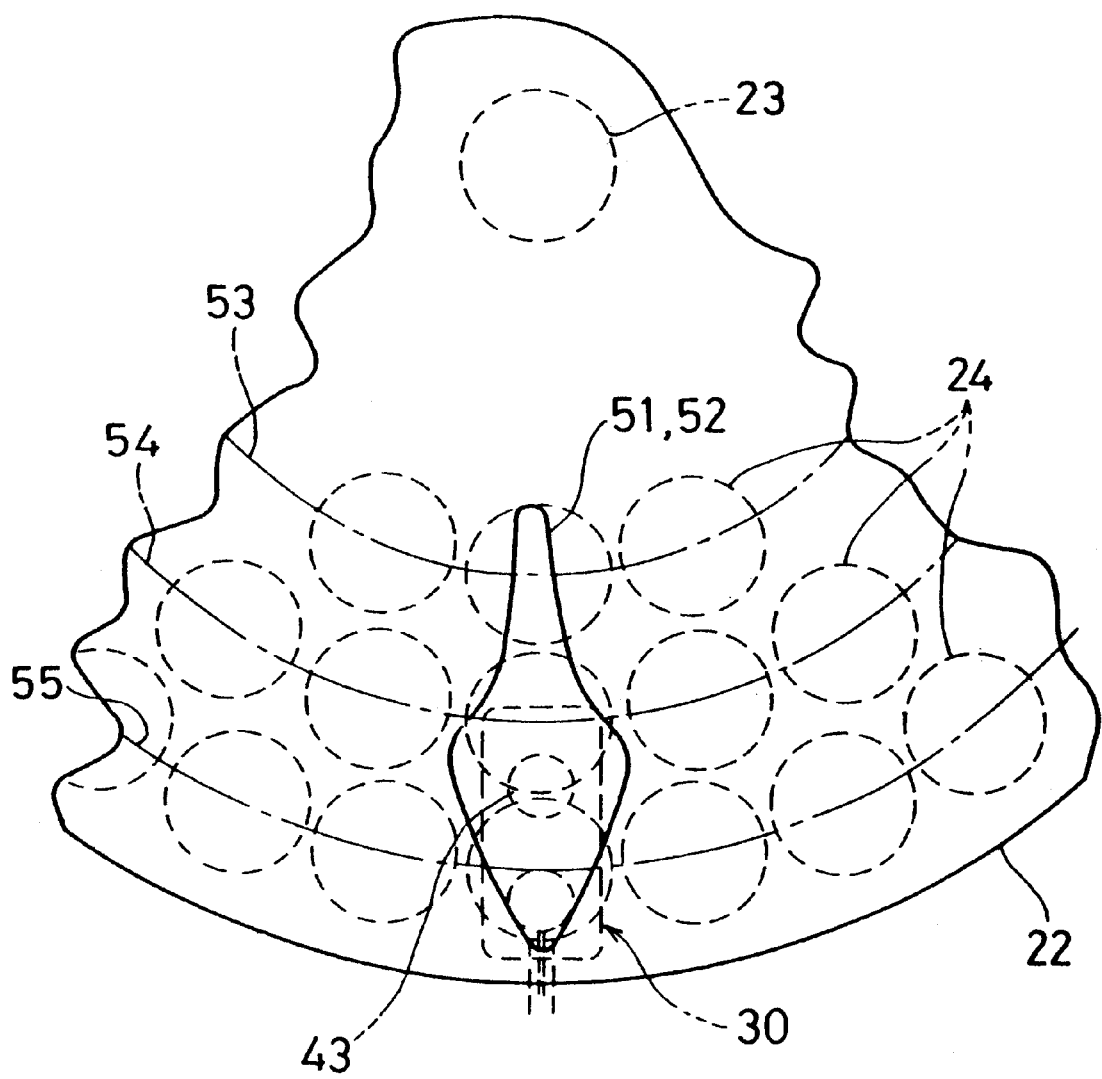
FIG. 8 is a partial plan view showing an arrangement position and a shape of a film thickness correction plate.

Also, a film thickness correction mechanism is fitted to an inside wall section of the water repellent film forming apparatus, and is arranged in a predetermined positional relationship with the water repellency processing mechanism having the above configuration. The film thickness correction mechanism is composed of film thickness correction plates 51 and 52 respectively arranged at upper and lower sides of the substrate holder 22. In the above apparatus, the film thickness correction plate 51 is arranged between the water repellency processing unit 30 and the substrate holder 22 in a state of being parallel with them, while the film thickness correction plate 52 is arranged between the water repellency processing unit 40 and the substrate holder 22 in a state of being parallel with them. The film thickness correction plates 51 and 52 are, from a viewpoint of function, mask members for covering the plastic base materials 24 which come near to the water repellency processing units 30 and 40 based on the rotating action of the substrate holder 22. As shown in FIG. 8, since the plastic base materials 24 which are arranged in the radial direction of the holder and concentric circle arrangement mode are partially covered with the film thickness correction plate working as the mask member having a desirable covering pattern shape, the water repellent substances to be evaporated are partially obstructed by the correction plate and this construction makes it possible to correct the film thickness of the water repellent film deposited on the surfaces of each plastic base material 24 and to make the film thickness on the surfaces uniform. The film thickness correction plate 51 and 52 are arranged so that their longitudinal directions are parallel to a direction of a straight line connecting the central section and the peripheral section in the substrate holder 12, that is, the diameter direction of the substrate holder. In FIG. 8, circles 53–55 are the concentric circles on which the plastic base materials 24 are arranged and as to their linear velocities due to their rotation the outer velocity becomes faster than the inner velocity.

One of the causes producing the film thickness difference (variation) is considered to be a relative positional relationship between an evaporation source which is the water repellent material chip and the lens (when the distance in height is constant). In FIG. 8, the evaporation source is arranged a little to the outside of the middle of the lenses arranged on three concentric circles. That is, the evaporation source is placed at the outer spot because the linear velocity of the lenses arranged in the outer section is increased, and further, an area of the section in the correction plate corresponding to the outside region becomes wide because the lenses close to the evaporation source are deposited so as to be thicker than the other lenses, while the section in the correction plate corresponding to the inside region is narrowly formed to have a narrow area because the lenses arranged in the inside region are far from the evaporation source.

As the plan shapes of the film thickness correction plates 41 and 42, the shape shown in FIG. 8, that is, the shape having a predetermined length in the diameter direction and the inside end with a narrow shape and a reduced area as going away from the evaporation source in view of the relative position (including a distance in height) between the lenses on the substrate holder and the evaporation source and the linear velocity due to the rotation of the substrate holder dependent on the lenses arrangement, is preferable. However, the plan shape of the film thickness correction plates is not limited to the above shape especially. Further, the arrangement position of the evaporation source is a little to the outside of the middle of the lenses arrangement and concretely it is preferable for the arrangement position to be in the range from ½ of the radius of the substrate holder to the distance no more than ⅔ of the radius on the basis of the center of the substrate holder.

When comparing the case of using the film thickness correction plate in the water repellency processing mechanism as mentioned above with the case of not using the above plate, in the latter case, lack of uniformity as to the film thickness is occurred and therefore dispersion of the water repellent performance and dispersion of interference colors in an antireflection film are occurred as a first line (inner side) to a third line (outer side) concerning the plastic base materials 24. To the contrary, in the former case, these defects are disappeared and the water repellent film with the uniform film distribution can be formed. A table shown in FIG. 9 indicates a result of a performance test dependent on the case of using the film thickness correction plate and the case of not using it. As indicated in this table, the difference between the two cases becomes remarkable particularly when an amount of the films to be deposited is increased, and when using the film thickness correction plate, and angle of contact in each of the plastic base materials arranged on the first line to the third line becomes uniform, and the difference in the change of the interference color gets less.

Further, the application of the film thickness correction mechanism is not limited to the both sides simultaneous water repellency processing mechanism of the present embodiment, and it can be also used for an one side water repellency processing mechanism.

In accordance with the above film thickness correction mechanism, since the film thickness correction plate is arranged between the water repellency processing unit and the substrate holder in the predetermined positional relationship to the optical lens base materials arranged on the substrate holder, when depositing the water repellent film on the surfaces of the optical lens base materials by means of the vacuum evaporation method, the thickness of the water repellent film can be equalized and an excellent film thickness distribution can be realized, and further lens characteristics such as the water repellency performance and so on can be improved. Especially, in case of arranging a lot of optical lens base materials on the substrate holder in a concentric circle positional relationship, the difference of film thickness of the water repellent film deposited on the surfaces of the optical lens base materials arranged in the inner side and the outer side becomes smaller, and the film thickness distribution in a plurality of optical lens base materials which are included in a unit of a lot defined by a substrate holder (lens tray) as a unit can be made uniform.

Industrial Applicability

Since an upper side water repellency processing unit and a lower side water repellency processing unit are arranged in the vacuum processing chamber for depositing the water repellent film on the surfaces of the optical lens base materials, the configuration of the present invention is fit for forming the water repellent films on the both side of the optical lens base materials simultaneously, and for rising an efficiency of deposition processing of the water repellent film and improving work efficiency and productivity. Further, when depositing the water repellent film on the surface of the optical lens base material by utilizing the vacuum evaporation method in the water repellent processing, this invention is fit for the equalization of the thickness of the water repellent film on the optical lens base material and the improvement of lens characteristics such as the water repellent performance and so on. Especially, as to the optical lens, the present invention is preferable for a spectacle lens with a meniscus shape.

What is claimed is:

1. In a vacuum processing chamber (16) wherein a holder (22) on which a plurality of optical lens base materials (24) are arranged is installed rotatably in a vacuum atmosphere and a water repellent film is deposited onto surfaces of said optical lens base materials (24), a both sides simultaneous water repellency processing mechanism characterized in that:

an upper side water repellency processing unit (30) and a lower side water repellency processing unit (40) are provided to said holder (22), wherein said upper side water repellency processing unit (30) forms a water repellent film on the upper side of said optical lens base materials (24) and said lower side water repellency processing unit (40) forms a water repellent film on the lower side of said optical lens base materials (24).

2. The both sides simultaneous water repellency processing mechanism according to claim 1 characterized in that said upper side water repellency processing unit (30) and said lower side water repellency processing unit (40) have respectively a water repellent material chip (33, 43) and a heater (32, 42) for heating said material chip.

3. The both sides simultaneous water repellency processing mechanism according to claim 2 characterized in that said upper side water repellency processing unit (30) and said lower side water repellency processing unit (40) have respectively a temperature measuring chip (36, 45), a temperature detecting means (35, 44) added to said temperature measuring chip, and a control means (37, 46) for controlling a heating temperature due to said heater on the basis of a detection signal outputted from said temperature detecting means.

4. The both sides simultaneous water repellency processing mechanism according to claim 2 characterized in that said water repellent material chip (33, 43) is provided with a heating board (34, 41).

5. The both sides simultaneous water repellency processing mechanism according to claim 3 characterized in that said upper side water repellency processing unit (30) is provided with a support plate (31) in which said water repellent material chip (33) and said temperature measuring chip (36) are mounted and faced to the upper side of said optical lens base materials (24).

6. The both sides simultaneous water repellency processing mechanism according to claim 3 characterized in that said lower side water repellency processing unit (40) is provided with a heating board (41) on which said water repellent material chip (43) and said temperature measuring chip (45) are mounted.

* * * * *